(12) United States Patent
Fan

(10) Patent No.: US 11,552,058 B2
(45) Date of Patent: Jan. 10, 2023

(54) METHOD OF TRANSFERRING MICRO LIGHT EMITTING DIODES AND DISPLAY PANEL

(71) Applicant: Shenzhen China Star Optoelectronics Semiconductor Display Technology Co., Ltd., Shenzhen (CN)

(72) Inventor: Yong Fan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/626,554

(22) PCT Filed: Dec. 10, 2019

(86) PCT No.: PCT/CN2019/124315
§ 371 (c)(1),
(2) Date: Dec. 25, 2019

(87) PCT Pub. No.: WO2021/056840
PCT Pub. Date: Apr. 1, 2021

(65) Prior Publication Data
US 2022/0216187 A1   Jul. 7, 2022

(30) Foreign Application Priority Data
Sep. 25, 2019   (CN) .......................... 201910913489.4

(51) Int. Cl.
*H01L 25/07*   (2006.01)
*H01L 25/075*  (2006.01)
(Continued)

(52) U.S. Cl.
CPC ...... *H01L 25/0753* (2013.01); *H01L 21/6835* (2013.01); *H01L 33/20* (2013.01);
(Continued)

(58) Field of Classification Search
CPC . H01L 25/0753; H01L 21/6835; H01L 33/20; H01L 2221/68368;
(Continued)

(56) References Cited

U.S. PATENT DOCUMENTS 10,332,949 B2    6/2019  Takeya et al.
11,276,798 B2 *  3/2022  Hwang ................... H01L 33/62
(Continued)

FOREIGN PATENT DOCUMENTS

CN    107833525 A    3/2018
CN    107852794 A    3/2018
(Continued)

*Primary Examiner* — Mohammad M Hoque
(74) *Attorney, Agent, or Firm* — PV IP PC; Wei Te Chung; Ude Lu

(57) ABSTRACT

Provided are a micro light emitting diodes and a method of transferring the same. The method includes providing an array substrate with the micro light emitting diodes; adhering abnormal micro light emitting diodes of the array substrate on a first carrying plate; adhering the abnormal micro light emitting diodes on the first carrying plate to a laser deformation glue layer of a second carrying plate; irradiating the laser deformation glue layer by a laser to flip the abnormal micro light emitting diodes; transferring the abnormal micro light emitting diodes from the second carrying plate to a third carrying plate; and transferring again to the array substrate.

15 Claims, 7 Drawing Sheets

(51) Int. Cl.
*H01L 21/683* (2006.01)
*H01L 33/20* (2010.01)

(52) U.S. Cl.
CPC ............... *H01L 2221/68368* (2013.01); *H01L 2221/68381* (2013.01); *H01L 2224/95133* (2013.01); *H01L 2224/95136* (2013.01); *H01L 2224/98* (2013.01)

(58) Field of Classification Search
CPC . H01L 2221/68381; H01L 2224/95133; H01L 2224/95136; H01L 2224/98; H01L 24/95; H01L 33/0095; H01L 27/156
USPC .......................................................... 257/91
See application file for complete search history.

(56) References Cited

U.S. PATENT DOCUMENTS

| | | | |
|---|---|---|---|
| 2017/0140961 A1 | 5/2017 | Sasaki et al. | |
| 2018/0190614 A1* | 7/2018 | Kumar | ................... H01L 24/05 |
| 2019/0304817 A1* | 10/2019 | Ahn | ....................... B65G 47/92 |
| 2019/0304854 A1* | 10/2019 | Ahn | ....................... H01L 22/14 |
| 2020/0058533 A1 | 2/2020 | Zou et al. | |
| 2020/0357951 A1* | 11/2020 | Park | .................... H01L 33/0095 |
| 2021/0043797 A1* | 2/2021 | Ahn | .................... H01L 25/0753 |

FOREIGN PATENT DOCUMENTS

| | | |
|---|---|---|
| CN | 107910413 A | 4/2018 |
| CN | 108461438 A | 8/2018 |
| CN | 207705223 U | 8/2018 |
| CN | 109065677 A | 12/2018 |
| CN | 109524339 A | 3/2019 |
| CN | 109585342 A | 4/2019 |
| CN | 109950182 A | 6/2019 |
| CN | 110047785 A | 7/2019 |

* cited by examiner

METHOD OF TRANSFERRING MICRO LIGHT EMITTING DIODES AND DISPLAY PANEL

FIELD

The present disclosure relates to display technologies, and more particularly, to a method of transferring micro light emitting diodes and a display panel.

BACKGROUND

In recent years, with development of science and technology, in order to meet high requirements of users for display quality, science and technology workers have gradually turned to research on micro light-emitting diodes (micro LEDs) from ordinary light-emitting diodes (LEDs).

The micro LEDs reduce a size of ordinary light-emitting diodes to 1%, and a length of micro LEDs is less than 100 micrometers. At present, in a process of transferring the micro LED device to the array substrate, there are cases where the micro LED device is inverted and a positive electrode and a negative electrode of the micro LED device are misaligned, which affects transfer and assembly efficiency of the micro LED device. Therefore, there is a need to solve the above issues.

SUMMARY

In view of the above, the present disclosure provides a method of transferring micro light emitting diodes to improve transfer and assembly efficiency of the micro LED device.

In order to achieve above-mentioned object of the present disclosure, one embodiment of the disclosure provides a method of transferring micro light emitting diodes, including steps of:

providing an array substrate, wherein the array substrate is provided with a mounting layer thereon, the mounting layer is provided with several holes, the holes are configured to expose pixel electrodes of the array substrate, and a shape of each of the holes is an isosceles trapezoid;

transferring the micro light emitting diodes into the corresponding holes of the mounting layer, wherein each of the micro light emitting diodes includes a light emitting portion and an electrode portion, the electrode portion is disposed at one side of the light emitting portion, and a shape of each of the micro light emitting diodes is an isosceles trapezoid;

providing a first carrying plate configured to adhere abnormal micro light emitting diodes of the array substrate to the first carrying plate, wherein the abnormal micro light emitting diodes are the micro light emitting diodes each with the electrode portion facing openings of the holes;

providing a second carrying plate with a laser deformation glue layer thereon, and adhering the abnormal micro light emitting diodes on the first carrying plate to the laser deformation glue layer of the second carrying plate;

irradiating the laser deformation glue layer by a laser to flip the abnormal micro light emitting diodes;

providing a third carrying plate, and transferring the abnormal micro light emitting diodes from the second carrying plate to the third carrying plate; and transferring the abnormal micro light emitting diodes from the third carrying plate into the holes of the mounting layer.

In one embodiment of the method of transferring the micro light emitting diodes of the disclosure, each of the micro light emitting diodes includes a first side and a second side disposed opposite the first side, the first side is a long side of the isosceles trapezoid, the second side is a short side of the isosceles trapezoid, the electrode portion includes a first electrode and a second electrode, the first electrode is disposed at the first side, and the second electrode is disposed at the second side.

In one embodiment of the method of transferring the micro light emitting diodes of the disclosure, the step of providing the first carrying plate configured to adhere the abnormal micro light emitting diodes to the first carrying plate, wherein the abnormal micro light emitting diodes are the micro light emitting diodes each with the electrode portion facing the openings of the holes, includes:

providing the first carrying plate coated with an electrically conductive layer, applying electrical potential to the first carrying plate, and adhering the abnormal micro light emitting diodes on the first carrying plate by electrostatic force adhesion.

In one embodiment of the method of transferring the micro light emitting diodes of the disclosure, the step of providing the second carrying plate with the laser deformation glue layer thereon, and adhering the abnormal micro light emitting diodes on the first carrying plate to the laser deformation glue layer of the second carrying plate, includes:

providing the second carrying plate and coating the laser deformation glue layer on a surface of the second carrying plate, wherein the laser deformation glue layer includes an acrylic resin material, a photosensitizer and a tackifier.

In one embodiment of the method of transferring the micro light emitting diodes of the disclosure, the step of irradiating the laser deformation glue layer by the laser to flip the abnormal micro light emitting diodes, includes:

irradiating the laser deformation glue layer provided with the abnormal micro light emitting diodes by the laser to flip the abnormal micro light emitting diodes one by one surrounding a symmetry axis of each of the abnormal micro light emitting diodes.

In one embodiment of the method of transferring the micro light emitting diodes of the disclosure, a surface of the third carrying plate is provided with a glue layer, the abnormal micro light emitting diodes are adhered on the glue layer after the step of transferring the abnormal micro light emitting diodes from the second carrying plate to the third carrying plate.

In one embodiment of the method of transferring the micro light emitting diodes of the disclosure, the third carrying plate is provided with a metallic layer and the metallic layer is supplied with electricity to attract and adhere the abnormal micro light emitting diodes from the second carrying plate to the third carrying plate.

Furthermore, another embodiment of the disclosure provides a method of transferring micro light emitting diodes, including steps of:

providing an array substrate, wherein the array substrate is provided with a mounting layer thereon, the mounting layer is provided with several holes, and the holes are configured to expose pixel electrodes of the array substrate;

transferring the micro light emitting diodes into the corresponding holes of the mounting layer, wherein each of the micro light emitting diodes includes a light emitting portion and an electrode portion, and the electrode portion is disposed at one side of the light emitting portion;

providing a first carrying plate configured to adhere abnormal micro light emitting diodes of the array substrate to the first carrying plate, wherein the abnormal micro light emitting diodes are the micro light emitting diodes each with the electrode portion facing openings of the holes;

providing a second carrying plate with a laser deformation glue layer thereon, and adhering the abnormal micro light emitting diodes on the first carrying plate to the laser deformation glue layer of the second carrying plate;

irradiating the laser deformation glue layer by a laser to flip the abnormal micro light emitting diodes;

providing a third carrying plate, and transferring the abnormal micro light emitting diodes from the second carrying plate to the third carrying plate; and transferring the abnormal micro light emitting diodes from the third carrying plate into the holes of the mounting layer.

In one embodiment of the method of transferring the micro light emitting diodes of the disclosure, a shape of each of the holes is an isosceles trapezoid.

In one embodiment of the method of transferring the micro light emitting diodes of the disclosure, a shape of each of the micro light emitting diodes is an isosceles trapezoid, each of the micro light emitting diodes includes a first side and a second side disposed opposite the first side, the first side is a long side of the isosceles trapezoid, the second side is a short side of the isosceles trapezoid, the electrode portion includes a first electrode and a second electrode, the first electrode is disposed at the first side, and the second electrode is disposed at the second side.

In one embodiment of the method of transferring the micro light emitting diodes of the disclosure, the step of providing the first carrying plate configured to adhere the abnormal micro light emitting diodes to the first carrying plate, wherein the abnormal micro light emitting diodes are the micro light emitting diodes each with the electrode portion facing the openings of the holes, includes: providing the first carrying plate coated with an electrically conductive layer, applying electrical potential to the first carrying plate, and adhering the abnormal micro light emitting diodes on the first carrying plate by electrostatic force adhesion.

In one embodiment of the method of transferring the micro light emitting diodes of the disclosure, the step of providing the second carrying plate with the laser deformation glue layer thereon, and adhering the abnormal micro light emitting diodes on the first carrying plate to the laser deformation glue layer of the second carrying plate, includes: providing the second carrying plate and coating the laser deformation glue layer on a surface of the second carrying plate, wherein the laser deformation glue layer includes an acrylic resin material, a photosensitizer and a tackifier.

In one embodiment of the method of transferring the micro light emitting diodes of the disclosure, the step of irradiating the laser deformation glue layer by the laser to flip the abnormal micro light emitting diodes, includes: irradiating the laser deformation glue layer provided with the abnormal micro light emitting diodes by the laser to flip the abnormal micro light emitting diodes one by one surrounding a symmetry axis of each of the abnormal micro light emitting diodes.

In one embodiment of the method of transferring the micro light emitting diodes of the disclosure, a surface of the third carrying plate is provided with a glue layer, the abnormal micro light emitting diodes are adhered on the glue layer after the step of transferring the abnormal micro light emitting diodes from the second carrying plate to the third carrying plate.

In one embodiment of the method of transferring the micro light emitting diodes of the disclosure, the third carrying plate is provided with a metallic layer and the metallic layer is supplied with electricity to attract and adhere the abnormal micro light emitting diodes from the second carrying plate to the third carrying plate.

Furthermore, another embodiment of the disclosure provides a display panel, including:

an array substrate provided with a mounting layer, wherein the mounting layer is provided with several holes, and the holes are configured to expose pixel electrodes of the array substrate;

several micro light emitting diodes disposed into the corresponding holes of the mounting layer, wherein the micro light emitting diodes are electrically connected to the array substrate, each of the micro light emitting diodes includes:

a light emitting portion facing openings of the holes of the mounting layer; and an electrode portion disposed at one side of the light emitting portion and facing bottoms of the holes of the mounting layer.

In one embodiment of the display panel of the disclosure, a shape of each of the holes and a shape of each of the micro light emitting diodes are an isosceles trapezoid.

In one embodiment of the display panel of the disclosure, the isosceles trapezoid includes a long side and a short side, a first electrode of each of the micro light emitting diodes is disposed at the long side, and a second electrode of each of the micro light emitting diodes is disposed at the short side.

In comparison with prior art, the method of transferring the micro light emitting diodes and the display panel of the disclosure provides an array substrate. The array substrate is provided with a mounting layer thereon. The mounting layer is provided with several holes. The holes are configured to expose pixel electrodes of the array substrate. Transfer the micro light emitting diodes into the corresponding holes of the mounting layer. A shape of each of the holes and a shape of each of the micro light emitting diodes are an isosceles trapezoid. Each of the micro light emitting diodes includes a light emitting portion and an electrode portion. The electrode portion is disposed at one side of the light emitting portion. Provide a first carrying plate configured to adhere abnormal micro light emitting diodes of the array substrate to the first carrying plate. The abnormal micro light emitting diodes are the micro light emitting diodes each with the electrode portion facing openings of the holes. Provide a second carrying plate with a laser deformation glue layer thereon. Adhere the abnormal micro light emitting diodes on the first carrying plate to the laser deformation glue layer of the second carrying plate. Irradiating the laser deformation glue layer by a laser to flip the abnormal micro light emitting diodes. Provide a third carrying plate. Transfer the abnormal micro light emitting diodes from the second carrying plate to the third carrying plate. Transfer the abnormal micro light emitting diodes from the third carrying plate into the holes of the mounting layer. In the disclosure, the shape of each of the holes of the mounting layer and the shape of each of the micro light emitting diodes are the isosceles trapezoid. The micro LEDs can be assembled by brush, vibration or fluid to avoid from misaligned of a positive electrode and a negative electrode of the micro LEDs. In the disclosure, irradiating the laser deformation glue layer provided with the abnormal micro light emitting diodes by the laser to flip the abnormal micro light emitting diodes one by one to flip the inverted micro LEDs quickly. The method of transferring micro light emitting diodes and the display panel of the disclosure improve transfer and assembly efficiency of the micro LED device.

BRIEF DESCRIPTION OF DRAWINGS

In order to more clearly illustrate the technical solutions in the embodiments of the present application, the drawings used in the description of the embodiments will be briefly described below. It is obvious that the drawings in the following description are only some embodiments of the present application. Other drawings can also be obtained from those skilled in the art based on these drawings without paying any creative effort.

FIG. 9-1 is a schematic cross-sectional view of flipping the abnormal micro light emitting diodes according to an embodiment of the present disclosure.

DETAILED DESCRIPTION

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
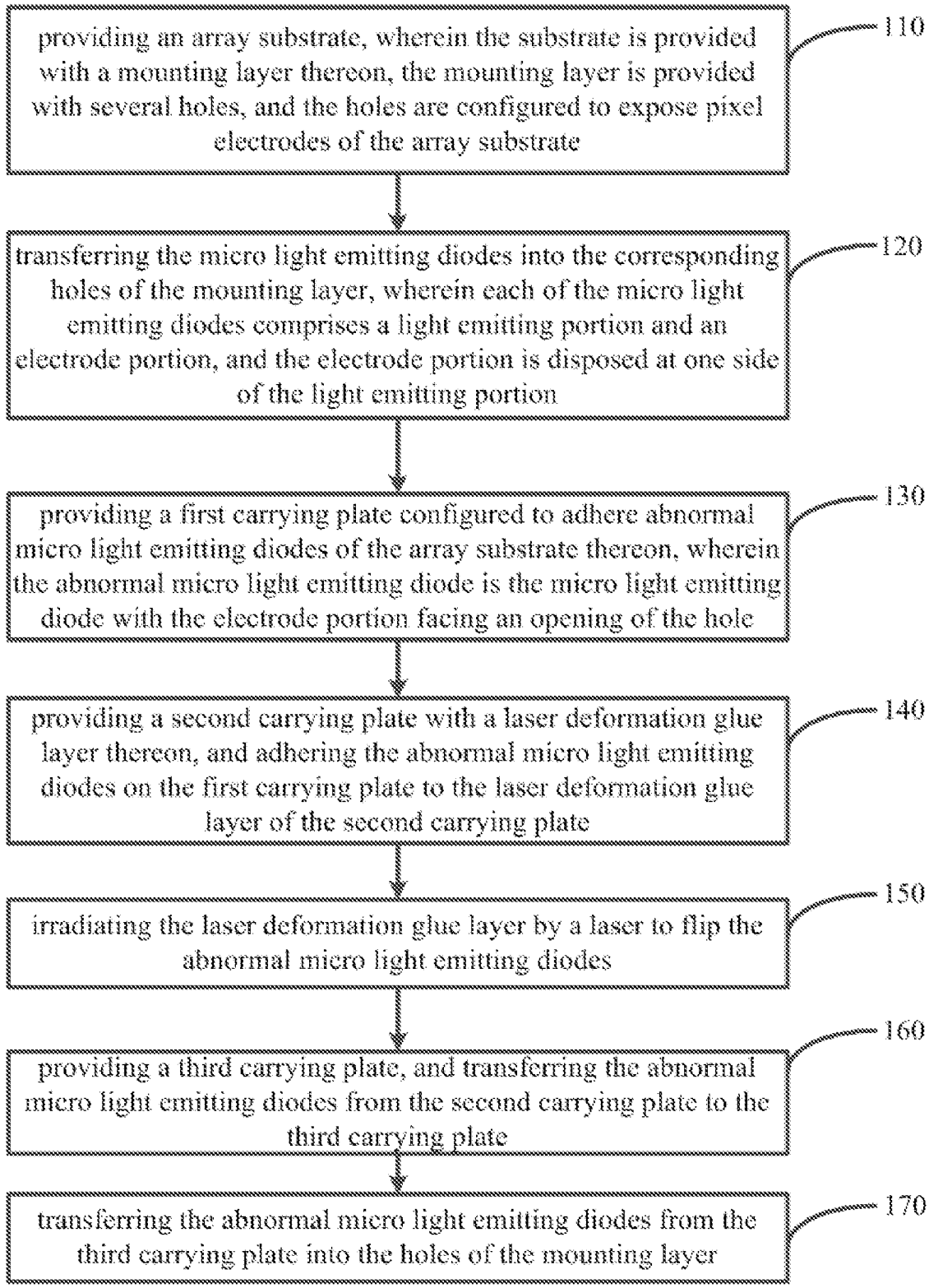
FIG. 1 is a schematic flowchart of a method of transferring micro light emitting diodes (micro LEDs) according to an embodiment of the present disclosure.

Referring to FIG. 1, FIG. 1 is a schematic flowchart of a method of transferring micro light emitting diodes according to an embodiment of the present disclosure. One embodiment of the disclosure provides a method of transferring micro light emitting diodes, including steps of:

Step 110: providing an array substrate 10, wherein the array substrate 10 is provided with a mounting layer 40 thereon, the mounting layer 40 is provided with several holes 20, the holes 20 are configured to expose pixel electrodes of the array substrate 10.

Figure 2:
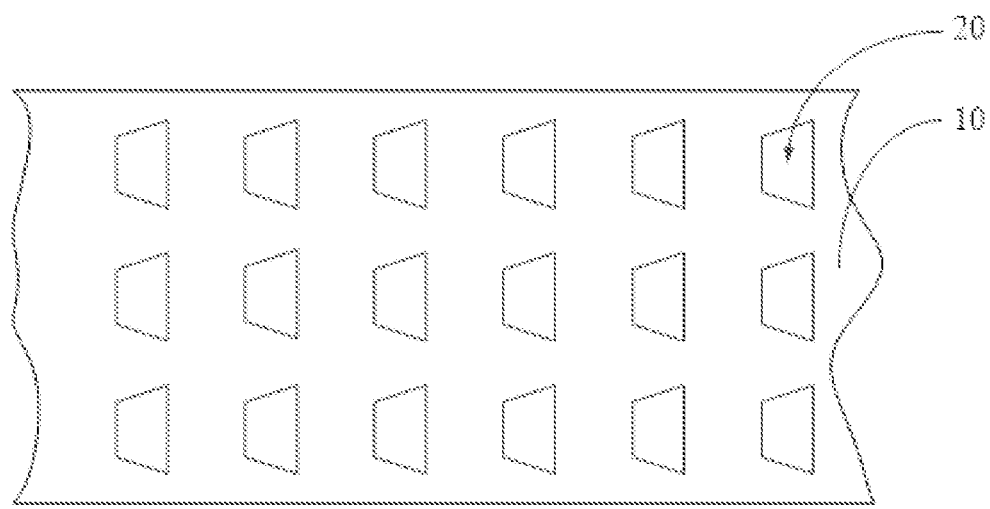
FIG. 2 is a schematic top view of an array substrate according to an embodiment of the present disclosure.
Figure 3:
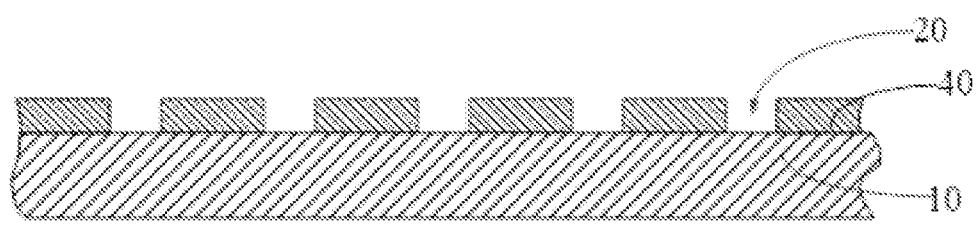
FIG. 3 is a schematic cross-sectional view of an array substrate according to an embodiment of the present disclosure.

Referring to FIG. 2, FIG. 2 is a schematic top view of an array substrate according to an embodiment of the present disclosure. Referring to FIG. 3, FIG. 3 is a schematic cross-sectional view of an array substrate according to an embodiment of the present disclosure. The array substrate 10 is utilized in liquid crystal display. The mounting layer 40 is disposed on a surface of the array substrate 10 provided with the pixel electrode. The mounting layer 40 is provided with several holes 20 to accommodate the micro light emitting diodes 30. A shape of each of the holes 20 is an isosceles trapezoid.

Step 120: transferring the micro light emitting diodes 30 into the corresponding holes 20 of the mounting layer, wherein each of the micro light emitting diodes 30 includes a light emitting portion 301 and an electrode portion 302, the electrode portion 302 is disposed at one side of the light emitting portion 301.

Figure 4:
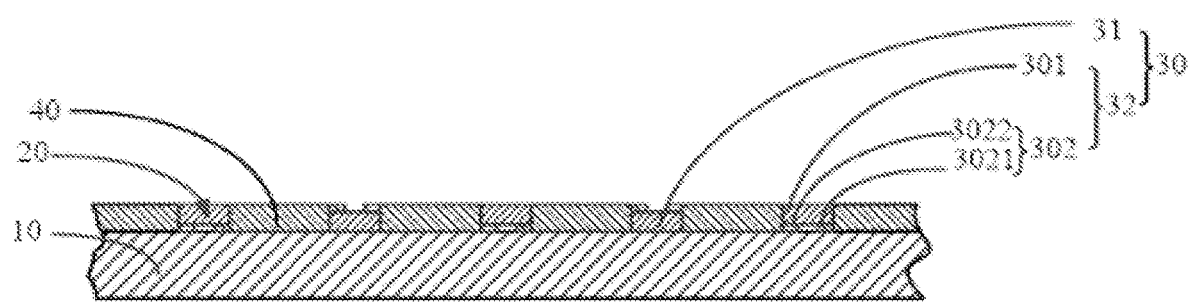
FIG. 4 is a schematic cross-sectional view of an array substrate provided with micro LEDs according to an embodiment of the present disclosure.

Referring to FIG. 4, FIG. 4 is a schematic cross-sectional view of an array substrate provided with micro LEDs according to an embodiment of the present disclosure. The micro LEDs 30 reduce a size of ordinary light-emitting diodes to 1%, and a length of micro LEDs is less than 100 micrometers. Assemble the micro light emitting diodes 30 into the holes 20 of the mounting layer 40. The micro light emitting diodes 30 can be assembled by brush, vibration or fluid to assemble the micro light emitting diodes 30 into the holes 20 of the mounting layer 40. In detail, transfer the micro light emitting diodes 30 arranged in an array on the carrying substrate to the holes 20 of the mounting layer 40 by a transferring head, until all of the holes 20 of the mounting layer 40 assembled with their micro light emitting diodes 30.

Figure 5:
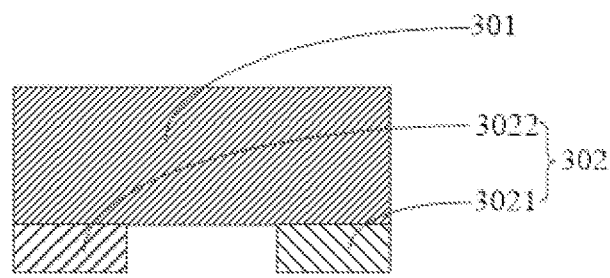
FIG. 5 is a schematic cross-sectional view of a micro LED according to an embodiment of the present disclosure.
Figure 6:
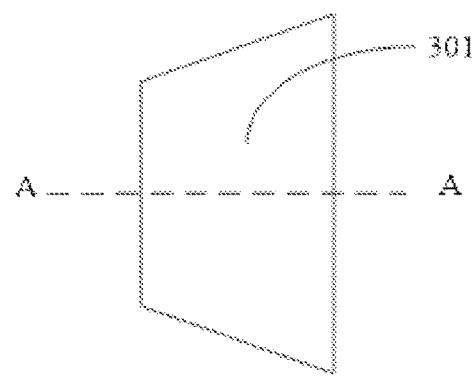
FIG. 6 is a schematic top view of a micro LED according to an embodiment of the present disclosure.

Referring to FIG. 5, FIG. 5 is a schematic cross-sectional view of a micro LED according to an embodiment of the present disclosure. Referring to FIG. 6, FIG. 6 is a schematic top view of a micro LED according to an embodiment of the present disclosure. A shape of each of the micro light emitting diodes 30 is the same with the shape of each of the holes 20, both are an isosceles trapezoid to avoid from misaligned of a positive electrode and a negative electrode of the micro LEDs. 30 in a process of micro light emitting diodes 30 assembly.

Figure 7:
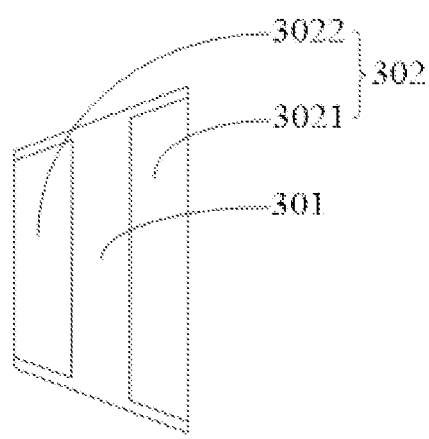
FIG. 7 is a schematic bottom view of a micro LED according to an embodiment of the present disclosure.

Referring to FIG. 7, FIG. 7 is a schematic bottom view of a micro LED according to an embodiment of the present disclosure. The electrode portion 302 of the micro light emitting diode 30 includes a first electrode 3021 and a second electrode 3022. The first electrode 3021 and the second electrode 3022 are disposed at opposite sides of the micro light emitting diode 30. The first electrode 3021 of the micro light emitting diode 30 is cathode. The second electrode 3022 of the micro light emitting diode 30 is anode. The cathode 3021 of the micro light emitting diode 30 and the anode 3022 of the micro light emitting diode 30 are disposed at a long side and at a short side of the isosceles trapezoid respectively. In some embodiment, the first electrode 3021 of the micro light emitting diode 30 is anode. The second electrode 3022 of the micro light emitting diode 30 is cathode.

Step 130: providing a first carrying plate 901 configured to adhere abnormal micro light emitting diodes 31 of the array substrate 10 to the first carrying plate 901, wherein the abnormal micro light emitting diodes 31 are the micro light emitting diodes 31 each with the electrode portion 302 facing openings of the holes.

Figure 8:
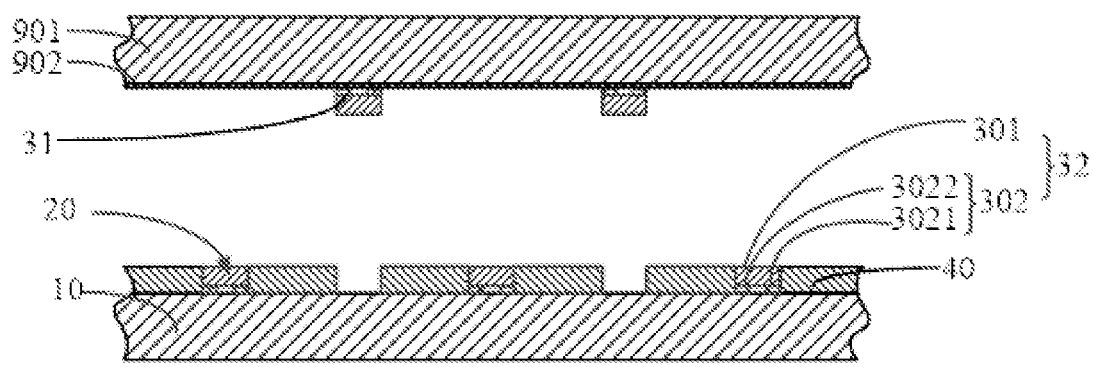
FIG. 8 is a schematic cross-sectional view of a micro LED transferring from the array substrate to a first carrying plate according to an embodiment of the present disclosure.

Referring to FIG. 8, FIG. 8 is a schematic cross-sectional view of a micro LED transferring from the array substrate to a first carrying plate according to an embodiment of the present disclosure. The first carrying plate 901 is configured to carry and transfer the abnormal micro light emitting diodes 31. Coat an electrically conductive layer 902 on the first carrying plate 901. Apply electrical potential to the first carrying plate by means of the electrically conductive character of the electrically conductive layer 902 of the first carrying plate 901. The electrically conductive layer 902 of the first carrying plate 901 adheres the electrode portion 302 of the abnormal micro light emitting diodes 31 by a function of an electric field to transfer the abnormal micro light emitting diodes 31 from the array substrate 10 to the electrically conductive layer 902 of the first carrying plate 901 the first carrying plate by electrostatic force adhesion. Inverted micro light emitting diodes 31 are transferred to the electrically conductive layer 902 of the first carrying plate 901.

An electrostatic force is greater for the abnormal micro light emitting diodes 31 to adhere from the array substrate 10 to the electrically conductive layer 902 of the first carrying plate 901 due to the electrode portion 302 of the abnormal micro light emitting diode 31 facing openings of the holes 20 of the mounting layer 40. An electrostatic force is small for the abnormal micro light emitting diodes 31 not to adhere from the array substrate 10 to the electrically conductive layer 902 of the first carrying plate 901 due to the electrode portion 302 of the abnormal micro light emitting diode 31 facing bottoms of the holes 20 of the mounting layer 40. Normal micro light emitting diodes can avoid from attracting and adhering to the electrically conductive layer 902 of the first carrying plate 901.

Step 140: providing a second carrying plate 101 with a laser deformation glue layer 102 thereon, and adhering the abnormal micro light emitting diodes 31 on the first carrying plate 901 to the laser deformation glue layer 102 of the second carrying plate 101.

Figure 9:
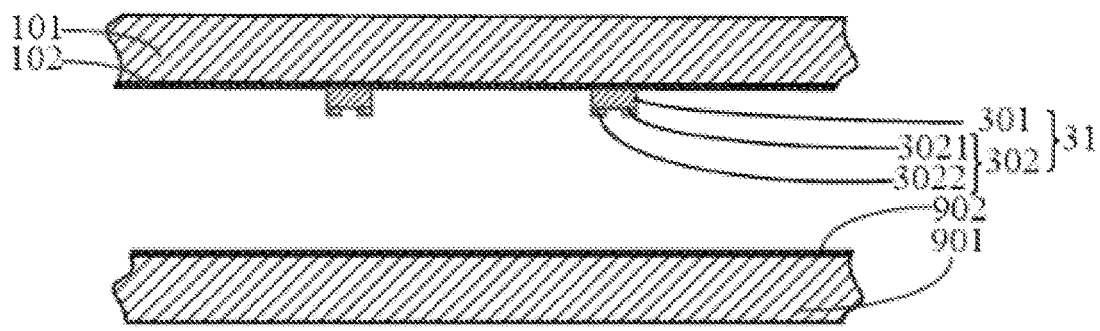
FIG. 9 is a schematic cross-sectional view of a micro LED transferring from the first carrying plate to a second carrying plate according to an embodiment of the present disclosure.
Figures 1, 9:
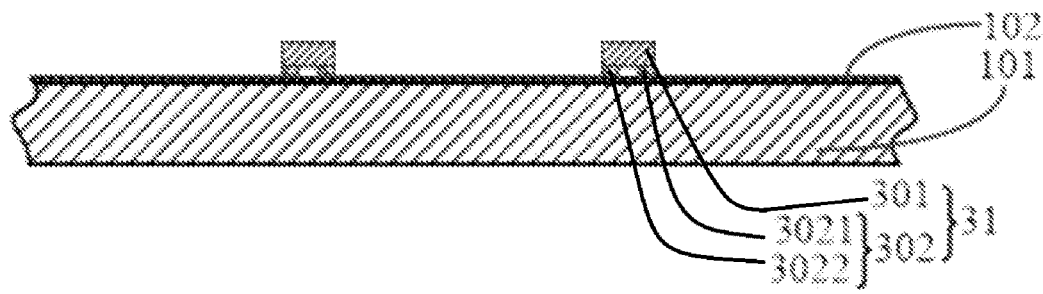

Referring to FIG. 9, FIG. 9 is a schematic cross-sectional view of a micro LED transferring from the first carrying plate to a second carrying plate according to an embodiment of the present disclosure. The second carrying plate 101 is configured to carry and transfer the abnormal micro light emitting diode 31. Coat the laser deformation glue layer 102 on the second carrying plate 101. A thickness of the coated laser deformation glue layer 102 is even. A viscosity of the coated laser deformation glue layer 102 is the same. The abnormal micro light emitting diodes 31 on the electrically conductive layer 902 of the first carrying plate 901 can adhere to the laser deformation glue layer 102 of the second carrying plate 101 by adhesion of the laser deformation glue layer 102 of the second carrying plate 101. The laser deformation glue layer 102 of the second carrying plate 101 includes an acrylic resin material, a photosensitizer and a tackifier.

Step 150: irradiating the laser deformation glue layer 102 by a laser to flip the abnormal micro light emitting diodes 31, as shown in FIG. 9-1.

Irradiate the laser deformation glue layer 102 provided with the abnormal micro light emitting diodes 31 from a bottom of the second carrying plate 101 in a direction perpendicular to the light emitting portion 301 of the abnormal micro light emitting diode 31 by a laser to flip the abnormal micro light emitting diodes 31 one by one along a symmetry axis A-A of each of the abnormal micro light emitting diodes 31. Move same distance of each abnormal micro light emitting diodes 31 in a direction of flipping.

Control a magnitude of energy, size of a light spot, a shape of the light spot, and a position of the light spot of the laser irradiated the micro light emitting diodes 31 to be the same to keep the direction of flipping and the distance of moving the same when the micro light emitting diodes 31 are flipping.

Angles of the direction of flipping of the micro light emitting diodes 31 may be 90 degrees, 150 degrees, or 180 degrees. Distances of moving of the micro light emitting diodes 31 may be 1 cm, 2 cm, or 3 cm. It can be moved to a required distance according to needs. The flipping angles of the micro light emitting diode 31 here are 180 degrees, and the moving distances in the flipping angles are the same in this embodiment.

Step 160: providing a third carrying plate 111, and transferring the abnormal micro light emitting diodes 31 from the second carrying plate 101 to the third carrying plate 111.

Figure 10:
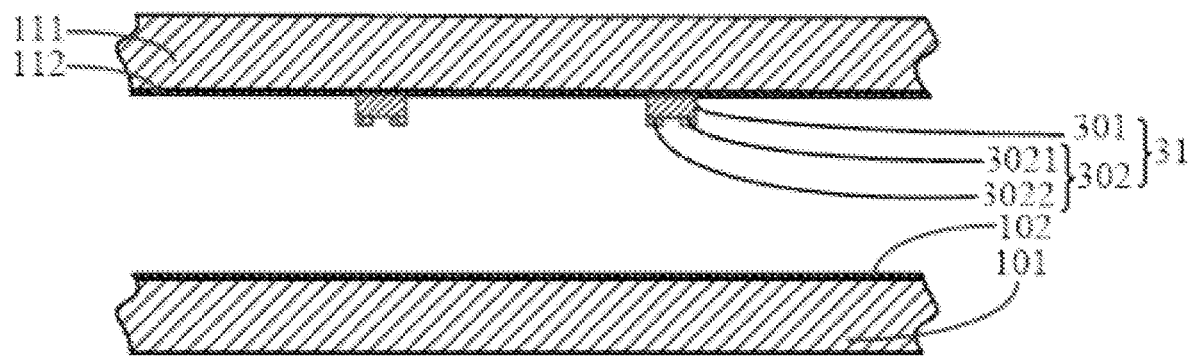
FIG. 10 is a schematic cross-sectional view of a micro LED transferring from the second carrying plate to a third carrying plate according to an embodiment of the present disclosure.

Referring to FIG. 10, FIG. 10 is a schematic cross-sectional view of a micro LED transferring from the second carrying plate to a third carrying plate according to an embodiment of the present disclosure. The third carrying plate 111 is configured to carry and transfer the abnormal micro light emitting diode 31. A surface of the third carrying plate 111 is provided with a glue layer 112. The glue layer 112 of the third carrying plate 111 adheres the electrode portion 302 of the abnormal micro light emitting diodes 31 to transfer the abnormal micro light emitting diodes 31 on the second carrying plate 101 to the glue layer 112 of the third carrying plate 111 by adhesion of the glue layer 112 of the third carrying plate 111.

The glue layer 112 of the third carrying plate 111 may include polydimethylsiloxane adhesive layer or acrylic adhesive layer.

Figure 11:
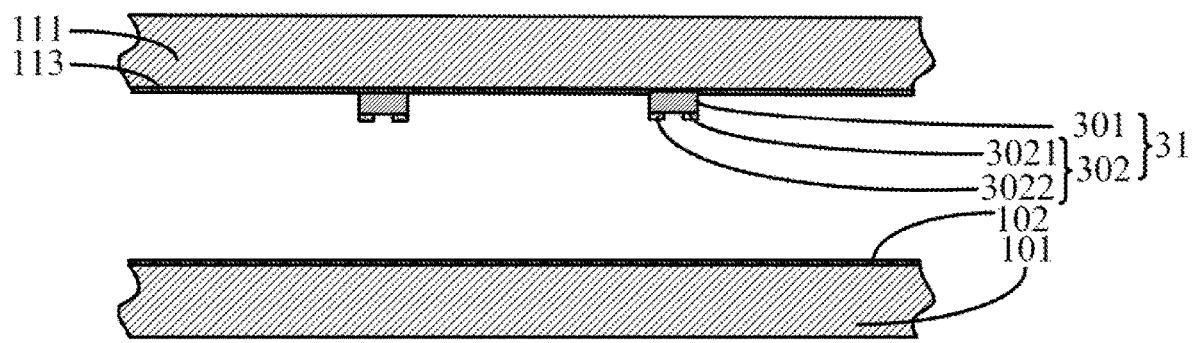
FIG. 11 is a schematic cross-sectional view of a micro LED transferring from the second carrying plate to a third carrying plate according to another embodiment of the present disclosure.

Referring to FIG. 11, FIG. 11 is a schematic cross-sectional view of a micro LED transferring from the second carrying plate to a third carrying plate according to another embodiment of the present disclosure. In another embodiment, the third carrying plate 111 is coated with a metallic layer 113. Apply electrical potential to the metallic layer 113 of the third carrying plate 111 by means of the electrically conductive character of the metallic layer 113 of the third carrying plate 111 to adhere the abnormal micro light emitting diodes 31 on the second carrying plate 101 to the metallic layer 113 of the third carrying plate.

The coated metallic layer 113 of the third carrying plate 111 includes Cu, Al, Ag, Au, Cr, or Mo.

Step 170: transferring the abnormal micro light emitting diodes 31 from the third carrying plate 111 into the holes 20 of the array substrate 10.

Figure 12:
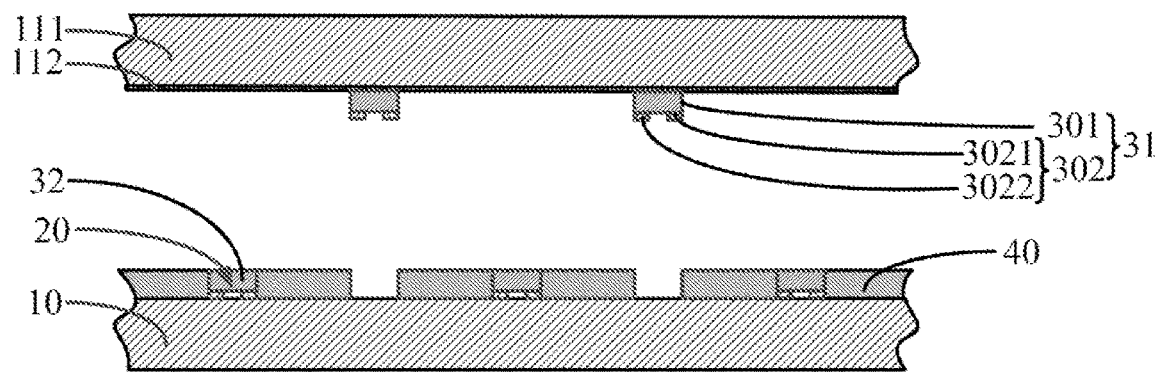
FIG. 12 is a schematic cross-sectional view of a micro LED transferring from the third carrying plate to the array substrate according to an embodiment of the present disclosure.
Figure 13:
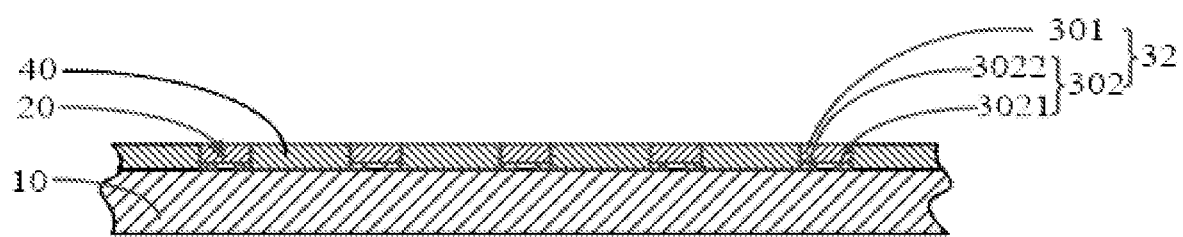
FIG. 13 is a schematic cross-sectional view of a display panel according to an embodiment of the present disclosure.

Referring to FIG. 12, FIG. 12 is a schematic cross-sectional view of a micro LED transferring from the third carrying plate to the array substrate according to an embodiment of the present disclosure. Referring to FIG. 13, FIG. 13 is a schematic cross-sectional view of a display panel according to an embodiment of the present disclosure. Transfer the abnormal micro light emitting diodes 31 from glue layer 112 of the third carrying plate 111 into the holes 20 of the mounting layer 40.

Furthermore, another embodiment of the disclosure provides a display panel. Referring to FIG. 13, FIG. 13 is a schematic cross-sectional view of a display panel according to an embodiment of the present disclosure.

The display panel includes an array substrate 10, holes 20, a mounting layer 40, micro light emitting diodes 32, an electrode portion 302 of the micro light emitting diodes 32, and a light emitting portion 301 of the micro light emitting diodes 32.

Referring to FIG. 2 and FIG. 3, FIG. 2 is a schematic top view of an array substrate according to an embodiment of the present disclosure. FIG. 3 is a schematic cross-sectional view of an array substrate according to an embodiment of the present disclosure. The array substrate 10 provided with a mounting layer 40, wherein the mounting layer 40 is provided with several holes 20, and the holes 20 are configured to expose pixel electrodes of the array substrate 10. The holes 20 are provided on the mounting layer 40 of the array substrate 10. A shape of each of the holes 20 is an isosceles trapezoid. The micro light emitting diodes 32 are disposed into the corresponding holes 20 of the array substrate 10. Referring to FIG. 6, FIG. 6 is a schematic top view of a micro LED according to an embodiment of the present disclosure. A shape of each of the micro light emitting diodes 32 is an isosceles trapezoid. Referring to FIG. 5, FIG. 5 is a schematic cross-sectional view of a micro LED according to an embodiment of the present disclosure. Each of the micro light emitting diodes 32 includes: a light emitting portion 301 and an electrode portion 302. The light emitting portion 301 of the micro light emitting diodes 32 is facing openings of the holes 20. The electrode portion 302 of the micro light emitting diodes 32 is disposed at one side of the light emitting portion 301. The electrode portion 302 of the micro light emitting diodes 32 is facing bottoms of the holes 20.

The electrode portion 302 of the micro light emitting diode 32 includes a first electrode 3021 and a second electrode 3022. The first electrode 3021 is disposed at a first side of the micro light emitting diode 32. The second electrode 3022 are disposed at a second side of the micro light emitting diode 32. The first side and the second side of the micro light emitting diode 32 are opposite to each other. The shape of each of the micro light emitting diodes 32 is an isosceles trapezoid. The first side of the micro light emitting diode 32 is disposed at the long side of the isosceles trapezoid. The second side of the micro light emitting diode 32 is disposed at the short side of the isosceles trapezoid. The first electrode 3021 is cathode. The second electrode 3022 is anode.

In some embodiment of the display panel, the first electrode 3021 of the micro light emitting diode 32 is anode. The second electrode 3022 of the micro light emitting diode 32 is cathode.

In comparison with prior art, the method of transferring the micro light emitting diodes and the display panel of the disclosure provides an array substrate. The array substrate is provided with a mounting layer thereon. The mounting layer is provided with several holes. The holes are configured to expose pixel electrodes of the array substrate. Transfer the micro light emitting diodes into the corresponding holes of the mounting layer. A shape of each of the holes and a shape of each of the micro light emitting diodes are an isosceles trapezoid. Each of the micro light emitting diodes includes a light emitting portion and an electrode portion. The electrode portion is disposed at one side of the light emitting portion. Provide a first carrying plate configured to adhere abnormal micro light emitting diodes of the array substrate to the first carrying plate. The abnormal micro light emitting diodes are the micro light emitting diodes each with the electrode portion facing openings of the holes. Provide a second carrying plate with a laser deformation glue layer thereon. Adhere the abnormal micro light emitting diodes on the first carrying plate to the laser deformation glue layer of the second carrying plate. Irradiating the laser deformation glue layer by a laser to flip the abnormal micro light emitting diodes. Provide a third carrying plate. Transfer the abnormal micro light emitting diodes from the second carrying plate to the third carrying plate. Transfer the abnormal micro light emitting diodes from the third carrying plate into the holes of the mounting layer. In the disclosure, the shape of each of the holes of the mounting layer and the shape of each of the micro light emitting diodes are the isosceles trapezoid. The micro LEDs can be assembled by brush, vibration or fluid to avoid from misaligned of a positive electrode and a negative electrode of the micro LEDs. In the disclosure, irradiating the laser deformation glue layer provided with the abnormal micro light emitting diodes by the laser to flip the abnormal micro light emitting diodes one by one to flip the inverted micro LEDs quickly. The method of transferring micro light emitting diodes and the display panel of the disclosure improve transfer and assembly efficiency of the micro LED device.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A method of transferring micro light emitting diodes, comprising steps of:
providing an array substrate, wherein the array substrate is provided with a mounting layer thereon, the mounting layer is provided with several holes, the holes are configured to expose pixel electrodes of the array substrate, and a shape of each of the holes is an isosceles trapezoid;
transferring the micro light emitting diodes into the corresponding holes of the mounting layer, wherein each of the micro light emitting diodes comprises a light emitting portion and an electrode portion, the electrode portion is disposed at one side of the light emitting portion, and a shape of each of the micro light emitting diodes is an isosceles trapezoid;
providing a first carrying plate configured to adhere abnormal micro light emitting diodes of the array substrate to the first carrying plate, wherein the abnormal micro light emitting diodes are the micro light emitting diodes each with the electrode portion facing openings of the holes;
providing a second carrying plate with a laser deformation glue layer thereon, and adhering the abnormal micro light emitting diodes on the first carrying plate to the laser deformation glue layer of the second carrying plate;
irradiating the laser deformation glue layer by a laser to flip the abnormal micro light emitting diodes;
providing a third carrying plate, and transferring the abnormal micro light emitting diodes from the second carrying plate to the third carrying plate; and
transferring the abnormal micro light emitting diodes from the third carrying plate into the holes of the mounting layer.

2. The method of transferring the micro light emitting diodes according to claim 1, wherein each of the micro light emitting diodes comprises a first side and a second side disposed opposite the first side, the first side is a long side of the isosceles trapezoid, the second side is a short side of the isosceles trapezoid, the electrode portion comprises a first electrode and a second electrode, the first electrode is disposed at the first side, and the second electrode is disposed at the second side.

3. The method of transferring the micro light emitting diodes according to claim 1, wherein the step of providing the first carrying plate configured to adhere the abnormal micro light emitting diodes to the first carrying plate, wherein the abnormal micro light emitting diodes are the micro light emitting diodes each with the electrode portion facing the openings of the holes, comprises:

providing the first carrying plate coated with an electrically conductive layer, applying electrical potential to the first carrying plate, and adhering the abnormal micro light emitting diodes on the first carrying plate by electrostatic force adhesion.

4. The method of transferring the micro light emitting diodes according to claim 1, wherein the step of providing the second carrying plate with the laser deformation glue layer thereon, and adhering the abnormal micro light emitting diodes on the first carrying plate to the laser deformation glue layer of the second carrying plate, comprises:

providing the second carrying plate and coating the laser deformation glue layer on a surface of the second carrying plate, wherein the laser deformation glue layer comprises an acrylic resin material, a photosensitizer and a tackifier.

5. The method of transferring the micro light emitting diodes according to claim 1, wherein the step of irradiating the laser deformation glue layer by the laser to flip the abnormal micro light emitting diodes, comprises:

irradiating the laser deformation glue layer provided with the abnormal micro light emitting diodes by the laser to flip the abnormal micro light emitting diodes one by one surrounding a symmetry axis of each of the abnormal micro light emitting diodes.

6. The method of transferring the micro light emitting diodes according to claim 1, wherein a surface of the third carrying plate is provided with a glue layer, the abnormal micro light emitting diodes are adhered on the glue layer after the step of transferring the abnormal micro light emitting diodes from the second carrying plate to the third carrying plate.

7. The method of transferring the micro light emitting diodes according to claim 1, wherein the third carrying plate is provided with a metallic layer and the metallic layer is supplied with electricity to attract and adhere the abnormal micro light emitting diodes from the second carrying plate to the third carrying plate.

8. A method of transferring micro light emitting diodes, comprising steps of:

providing an array substrate, wherein the array substrate is provided with a mounting layer thereon, the mounting layer is provided with several holes, and the holes are configured to expose pixel electrodes of the array substrate;

transferring the micro light emitting diodes into the corresponding holes of the mounting layer, wherein each of the micro light emitting diodes comprises a light emitting portion and an electrode portion, and the electrode portion is disposed at one side of the light emitting portion;

providing a first carrying plate configured to adhere abnormal micro light emitting diodes of the array substrate to the first carrying plate, wherein the abnormal micro light emitting diodes are the micro light emitting diodes each with the electrode portion facing openings of the holes;

providing a second carrying plate with a laser deformation glue layer thereon, and adhering the abnormal micro light emitting diodes on the first carrying plate to the laser deformation glue layer of the second carrying plate;

irradiating the laser deformation glue layer by a laser to flip the abnormal micro light emitting diodes;

providing a third carrying plate, and transferring the abnormal micro light emitting diodes from the second carrying plate to the third carrying plate; and transferring the abnormal micro light emitting diodes from the third carrying plate into the holes of the mounting layer.

9. The method of transferring the micro light emitting diodes according to claim 8, wherein a shape of each of the holes is an isosceles trapezoid.

10. The method of transferring the micro light emitting diodes according to claim 8, wherein a shape of each of the micro light emitting diodes is an isosceles trapezoid, each of the micro light emitting diodes comprises a first side and a second side disposed opposite the first side, the first side is a long side of the isosceles trapezoid, the second side is a short side of the isosceles trapezoid, the electrode portion comprises a first electrode and a second electrode, the first electrode is disposed at the first side, and the second electrode is disposed at the second side.

11. The method of transferring the micro light emitting diodes according to claim 8, wherein the step of providing the first carrying plate configured to adhere the abnormal micro light emitting diodes to the first carrying plate, wherein the abnormal micro light emitting diodes are the micro light emitting diodes each with the electrode portion facing the openings of the holes, comprises:

providing the first carrying plate coated with an electrically conductive layer, applying electrical potential to the first carrying plate, and adhering the abnormal micro light emitting diodes on the first carrying plate by electrostatic force adhesion.

12. The method of transferring the micro light emitting diodes according to claim 8, wherein the step of providing the second carrying plate with the laser deformation glue layer thereon, and adhering the abnormal micro light emitting diodes on the first carrying plate to the laser deformation glue layer of the second carrying plate, comprises:

providing the second carrying plate and coating the laser deformation glue layer on a surface of the second carrying plate, wherein the laser deformation glue layer comprises an acrylic resin material, a photosensitizer and a tackifier.

13. The method of transferring the micro light emitting diodes according to claim 8, wherein the step of irradiating the laser deformation glue layer by the laser to flip the abnormal micro light emitting diodes, comprises:

irradiating the laser deformation glue layer provided with the abnormal micro light emitting diodes by the laser to flip the abnormal micro light emitting diodes one by one surrounding a symmetry axis of each of the abnormal micro light emitting diodes.

14. The method of transferring the micro light emitting diodes according to claim 8, wherein a surface of the third carrying plate is provided with a glue layer, the abnormal micro light emitting diodes are adhered on the glue layer after the step of transferring the abnormal micro light emitting diodes from the second carrying plate to the third carrying plate.

15. The method of transferring the micro light emitting diodes according to claim 8, wherein the third carrying plate is provided with a metallic layer and the metallic layer is supplied with electricity to attract and adhere the abnormal micro light emitting diodes from the second carrying plate to the third carrying plate.

\* \* \* \* \*